United States Patent
Hoeks et al.

(10) Patent No.: US 7,965,373 B2
(45) Date of Patent: Jun. 21, 2011

(54) LITHOGRAPHIC APPARATUS AND DEVICE MANUFACTURING METHOD UTILIZING A DATAPATH HAVING A BALANCED CALCULATION LOAD

(75) Inventors: Martinus Hendricus Hendricus Hoeks, Breugel (NL); Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 1758 days.

(21) Appl. No.: 11/167,918

(22) Filed: Jun. 28, 2005

(65) Prior Publication Data
US 2007/0009146 A1 Jan. 11, 2007

(51) Int. Cl.
G03B 27/32 (2006.01)
G03B 27/42 (2006.01)
G03B 27/54 (2006.01)
G06F 17/50 (2006.01)
G06F 19/00 (2011.01)

(52) U.S. Cl. .............. 355/53; 355/67; 355/77; 700/121; 716/55

(58) Field of Classification Search .................... 355/53, 355/67, 75, 77, 55; 382/141, 232, 234, 239; 700/21, 121; 716/121, 55
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,533,170 A * | 7/1996 | Teitzel et al. | 358/1.8 |
| 5,579,147 A | 11/1996 | Mori et al. | |
| 5,677,703 A | 10/1997 | Bhuva et al. | |
| 5,701,151 A * | 12/1997 | Plakosh | 347/247 |
| 5,808,797 A | 9/1998 | Bloom et al. | |
| 5,963,211 A | 10/1999 | Oikawa et al. | |
| 5,982,553 A | 11/1999 | Bloom et al. | |
| 6,133,986 A | 10/2000 | Johnson | |
| 6,177,980 B1 | 1/2001 | Johnson | |
| 6,671,035 B2 | 12/2003 | Eurlings et al. | |
| 6,687,041 B1 | 2/2004 | Sandstrom | |
| 6,717,097 B1 | 4/2004 | Sandstrom et al. | |

(Continued)

FOREIGN PATENT DOCUMENTS

CN 1373862 A 10/2002

(Continued)

OTHER PUBLICATIONS

Search Report, dated Mar. 20, 2007, for EP Patent Application No. EP 06 25 3199, 9 pgs.

(Continued)

Primary Examiner — Hung Henry Nguyen
Assistant Examiner — Colin Kreutzer
(74) Attorney, Agent, or Firm — Sterne, Kessler, Goldstein & Fox P.L.L.C.

(57) ABSTRACT

A lithography apparatus with a data-path for converting a representation of a requested dose pattern to a sequence of control data suitable for controlling an array of individually controllable elements. The data path comprises a plurality of data manipulation devices and a calculation load controller for balancing a calculation load between the data manipulation devices. A device manufacturing method using elements of the lithography apparatus, and a flat panel display and integrated circuit device manufactured using the method.

20 Claims, 8 Drawing Sheets

U.S. PATENT DOCUMENTS

| | | |
|---|---|---|
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,106,417 B1* | 9/2006 | Amm ............................ 355/53 |
| 7,167,231 B2 | 1/2007 | Thuren et al. |
| 7,245,766 B2* | 7/2007 | Brown et al. ................. 382/199 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0274911 A1* | 12/2005 | Aloni et al. ............. 250/492.22 |
| 2006/0002627 A1* | 1/2006 | Dolan et al. ................. 382/286 |
| 2007/0121090 A1* | 5/2007 | Chen et al. ..................... 355/67 |

FOREIGN PATENT DOCUMENTS

| | | |
|---|---|---|
| CN | 1643453 A | 7/2005 |
| JP | 6-274608 A | 9/1994 |
| JP | 9-016805 A | 1/1997 |
| JP | 10-334054 A | 12/1998 |
| TW | 546550 B | 8/2003 |
| WO | WO 98/33096 | 7/1998 |
| WO | WO 98/38597 | 9/1998 |
| WO | WO 01/18606 A1 | 3/2001 |
| WO | WO 03/081338 A1 | 10/2003 |

OTHER PUBLICATIONS

Notification of Reasons for Refusal for Patent Application No. 2006-164126 mailed Jul. 21, 2009, 5 pgs.

English Abstract for Japanese Publication No. 2003-508825T published Mar. 4, 2003, 1 pg.

Office Action mailed Oct. 30, 2009 for Taiwan Patent Application No. 095121438, 4pgs.

* cited by examiner

| 708 | 701 | 702 | 703 | 704 | 705 | 706 | 707 |
| 707 | 708 | 701 | 702 | 703 | 704 | 705 | 706 |
| 706 | 707 | 708 | 701 | 702 | 703 | 704 | 705 |
| 705 | 706 | 707 | 708 | 701 | 702 | 703 | 704 |
| 704 | 705 | 706 | 707 | 708 | 701 | 702 | 703 |
| 703 | 704 | 705 | 706 | 707 | 708 | 701 | 702 |
| 702 | 703 | 704 | 705 | 706 | 707 | 708 | 701 |
| 701 | 702 | 703 | 704 | 705 | 706 | 707 | 708 |

530

520

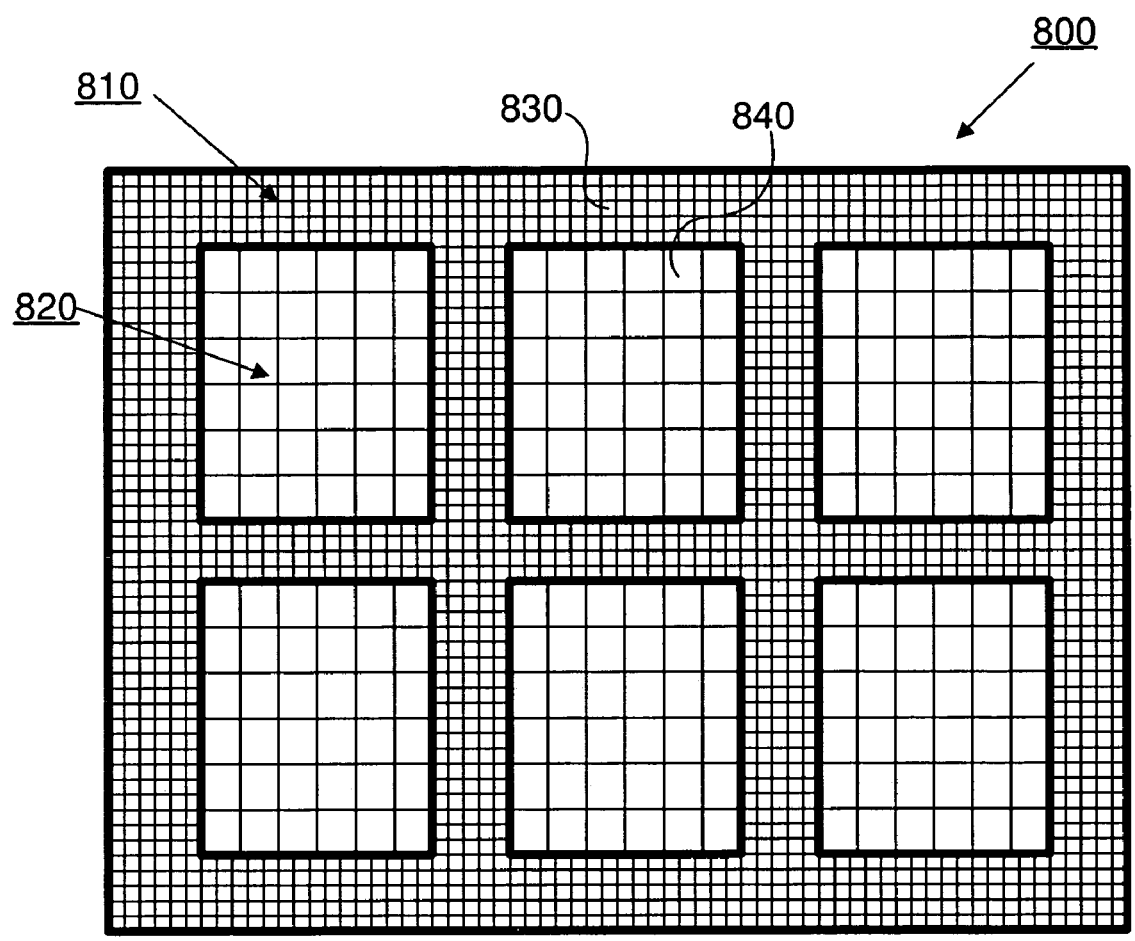

LITHOGRAPHIC APPARATUS AND DEVICE MANUFACTURING METHOD UTILIZING A DATAPATH HAVING A BALANCED CALCULATION LOAD

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate can be rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In the case where an array of individually controllable elements is used to generate the pattern on the substrate, the speed at which rasterized pattern data can be processed and passed to the array of individually controllable elements as a suitable control signal is a factor critical to the performance of the lithographic apparatus. A significant proportion of the overall cost of the apparatus is associated with the computational hardware provided to carry out this processing. The demands on computational hardware are particularly severe where processing has to be carried out at the same time as the substrate is being exposed (sometimes referred to as "on-the-fly" processing).

The pattern data can be exposed by a plurality of arrays of individually controllable elements, and each of these can be provided with separate optics and data processing hardware (all or part of each such assembly is sometimes referred to as an "optical column" or "optical engine"). Each optical column can be assigned predominantly to a particular strip of the substrate to be exposed and the data processing tasks can be split accordingly.

In order to be able to cope with variety in pattern layouts, each optical engine has to be provided with sufficient processing capacity to cope with the worse case scenario for the strip of pattern that it is to deal with, which is expensive.

Therefore, what is needed is a system and method where data processing is more efficiently managed.

SUMMARY

In one embodiment of the present invention, there is provided a lithographic apparatus comprising an array of individually controllable elements, and a data processing pipeline. The array of individually controllable elements modulate a beam of radiation. The data processing pipeline converts a first data representation of a requested dose pattern to a sequence of control data suitable for controlling the array of individually controllable elements in order substantially to form the requested dose pattern on a substrate. The data processing pipeline comprises a plurality of data manipulation devices and a calculation load controller. The calculation load controller divides the first data representation into a plurality of data packets, each corresponding to one of a set of sub-regions of the requested dose pattern, and forwards each of the data packets to one of the data manipulation devices. The calculation load controller selects the data packets to forward to each of the data manipulation devices so as to balance the total calculation load between the data manipulation devices.

In another embodiment of the present invention, there is provided a device manufacturing method comprising the following steps. Using an array of individually controllable elements to modulate a beam of radiation. Converting a first data representation of a requested dose pattern to a sequence of control data suitable for controlling the array of individually controllable elements in order substantially to form the requested dose pattern on a substrate. Dividing the first data representation into a plurality of data packets, each corresponding to one of a set of sub-regions of the requested dose pattern, and forward each of the data packets to one of a plurality of data manipulation devices for the conversion. Selecting the data packets to forward to each of the data manipulation devices in such a way that the total calculation load is balanced between the data manipulation devices.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 8 depicts an example requested dose pattern split into tiles of different sizes, according to one embodiment of the present invention.

Figure 1:
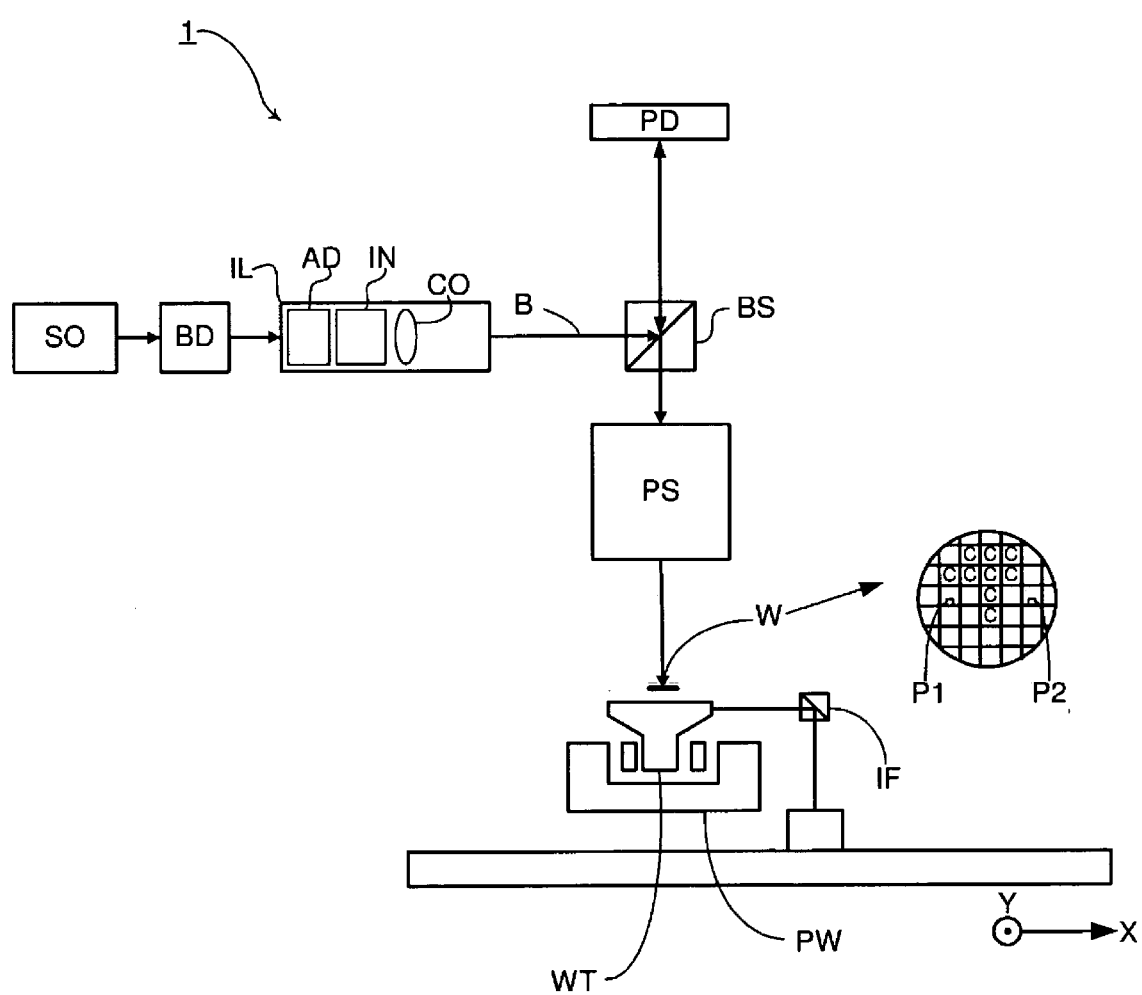
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts a lithographic apparatus according to one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features.

Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
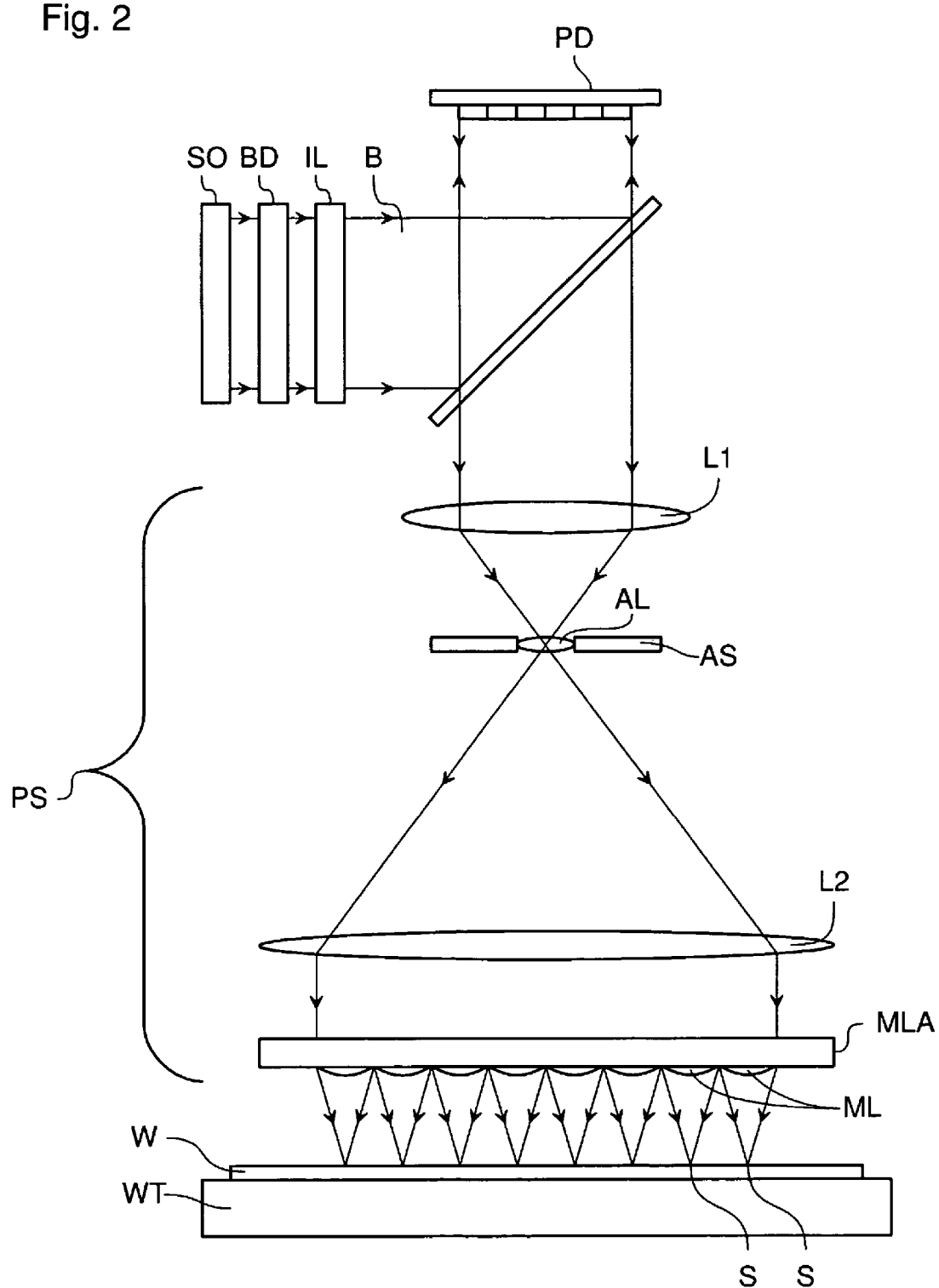

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes abeam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
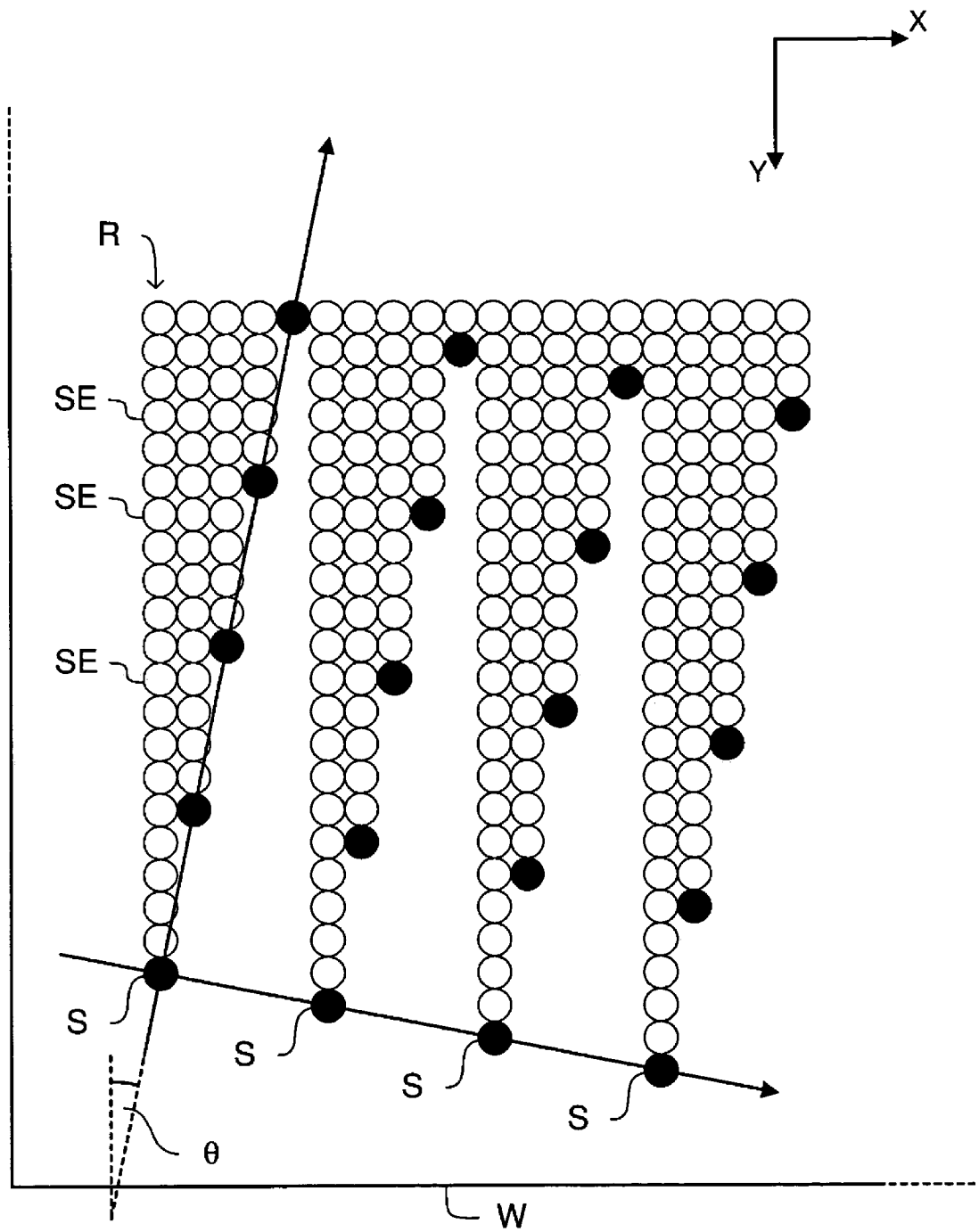
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
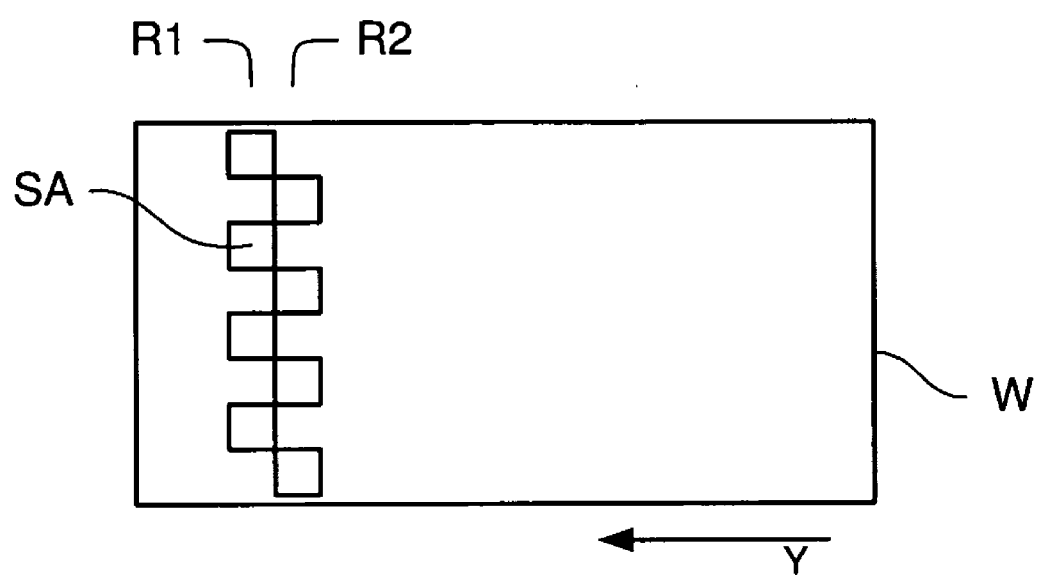
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays 31 of radiation spots S are produced by eight optical engines (not shown), arranged in two rows 32,33 in a 'chess board' configuration, such that the edge of one array of radiation spots S slightly overlaps (in the scanning direction Y) with the edge of the adjacent array of radiation spots 15. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

The datapath is configured to provide each of the optical engines with a sequence of control data suitable for producing the portion of the requested dose pattern to be exposed by that optical engine. Each sequence of control data is derived from a portion (or portions) of the requested dose pattern defined by the user. This derivation process typically involves a rasterization step (for example, converting a vector-based definition of the pattern to a bitmap representation) and/or a decompression step, either or both of which can have to be carried out online (i.e., substantially in real time), while the substrate is being exposed. It is not normally possible to produce control data directly from a raw (i.e., uncompressed) bitmap representation of the entire requested dose pattern because this representation would be too large to store all in an easily accessible and cost-effective manner.

A performance of the lithography apparatus is therefore dependent on the speed at which the data manipulation devices can carry out their respective calculations (e.g., rasterization, decompression etc.). For this reason, and because of the scale of the calculations required for typical dose patterns, in one example data manipulation devices are built from specialized computational hardware, optimized for the type of calculations concerned. For example, a massively parallel processing system comprising Field Programmable Gate Arrays can be used.

The complexity of the requested dose pattern can vary considerably from one region of the pattern to another, and is generally not known in advance. Indeed, it is desirable that a user of the lithography apparatus should have complete freedom when choosing the dose pattern. In one example, a choice of pattern should not affect the speed of the lithography process.

As described above, in one example, the patterning process can be dividing between a plurality of optical engines and data manipulation devices can be provided for each optical engine so as to produce the sequences of control data in parallel for each.

Figure 5:
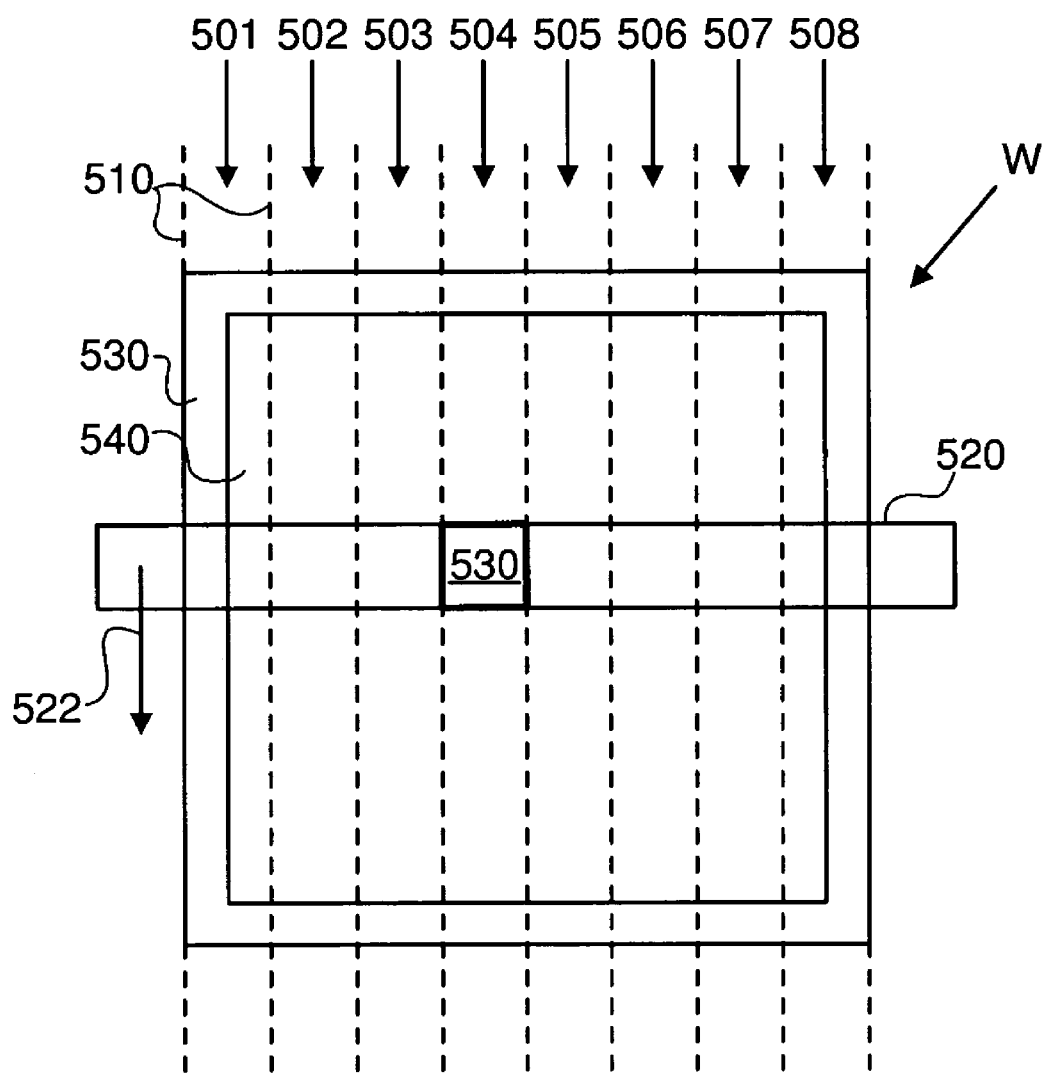
FIG. 5 depicts a calculation window and the distribution of a flat panel display pattern between optical engines, according to one embodiment of the present invention.

FIG. 5 shows how a flat panel display pattern can be formed, according to one embodiment of the present invention. Although some overlap can be desirable between patterns exposed by neighboring optical engines, broadly speaking the optical engines expose distinct "strips" of the requested dose pattern as indicated by arrows 501-508 and delimited by broken lines 510. In FIG. 5, the scanning direction of the substrate is upwards, parallel to Y, so that the upper portion of the pattern will be exposed first.

In one example, the control data for the patterning device(s) can be built up by scanning a "calculation window" 520 relative to the requested dose pattern (arrow 522), which has a finite width parallel to the scanning direction and represents the portion of the requested dose pattern that is to be input to a given set of data manipulation devices in order to perform a step in a particular processing stage (e.g., rasterization or decompression). For example, the data manipulation devices can produce packets of control data for each position of the window, which can be "stepped" forward, for example, once for each flash of the illuminating radiation. The geometry of the calculation window 520 depends on the exposure method. For example, the optical columns can expose the requested dose pattern, defined via a relatively dense bitmap, by scanning a relatively sparse array of spots over the substrate (each of these spot corresponding to one of the lenses in a micro-lens array, for example). According to this arrangement, spots are exposed simultaneously on a number of different lines of the dense bitmap pattern, which can affect the width and/or length of the calculation window 520 (e.g., the calculation window 520 can be chosen to be at least wide enough to encompass all adjacent lines of the bitmap pattern that can be exposed in any one flash of the radiation source). Additionally or alternatively, the data manipulation device calculations can require context information to be taken into account (e.g., to take account of the fact that each radiation spot exposed by the optical engine can overlap several lines of the bitmap representation of the requested dose pattern). This will tend to broaden the required width and/or length of the window 520.

The speed at which the data manipulation devices can perform the required operations for a given position of the window 520 will dictate how quickly the window 520 can be scanned over the substrate W, and therefore how quickly the requested dose pattern can be formed. For a given device architecture, the calculation speed will often depend on the nature of the requested dose pattern in the window 520, which can vary considerably for different regions of the window 520, as mentioned above. For the design shown in FIG. 5, for example, which is for a flat panel display, the calculations for the border regions 530 are likely to require quite different resources than calculations for the display area 540. The border regions 530 typically comprise patterning for connection wires, and the like, where the display area 540 typically comprises a large number of repeating patterns corresponding to the display pixels. The disorder or entropy of the border regions 530 is therefore likely to be higher than that of the display area 540 making these regions generally more difficult to process (i.e., they place greater demands on calculation hardware), both for decompression and for online rasterization.

In an example where data manipulation devices are restricted to providing control data for one particular optical engine, the calculation load is likely to vary greatly between different data manipulation devices due to the variation in the nature of the pattern to be exposed between optical engines. In FIG. 5, for example, the data manipulation devices that provide the control data for slices 501 and 508 will tend to have a much greater load than the others because a greater proportion of the pattern they process concerns the border areas 530. However, because it is undesirable to restrict the way in which a customer might want to arrange the pattern on the substrate, it is necessary to provide equal computing power for all of the slices 501-508. This means that, in this example, all of the data manipulation devices have to be provided with enough capacity to be able to cope with the worst-case scenario despite the fact that for most of the time such capacity will not be used.

Figure 6:
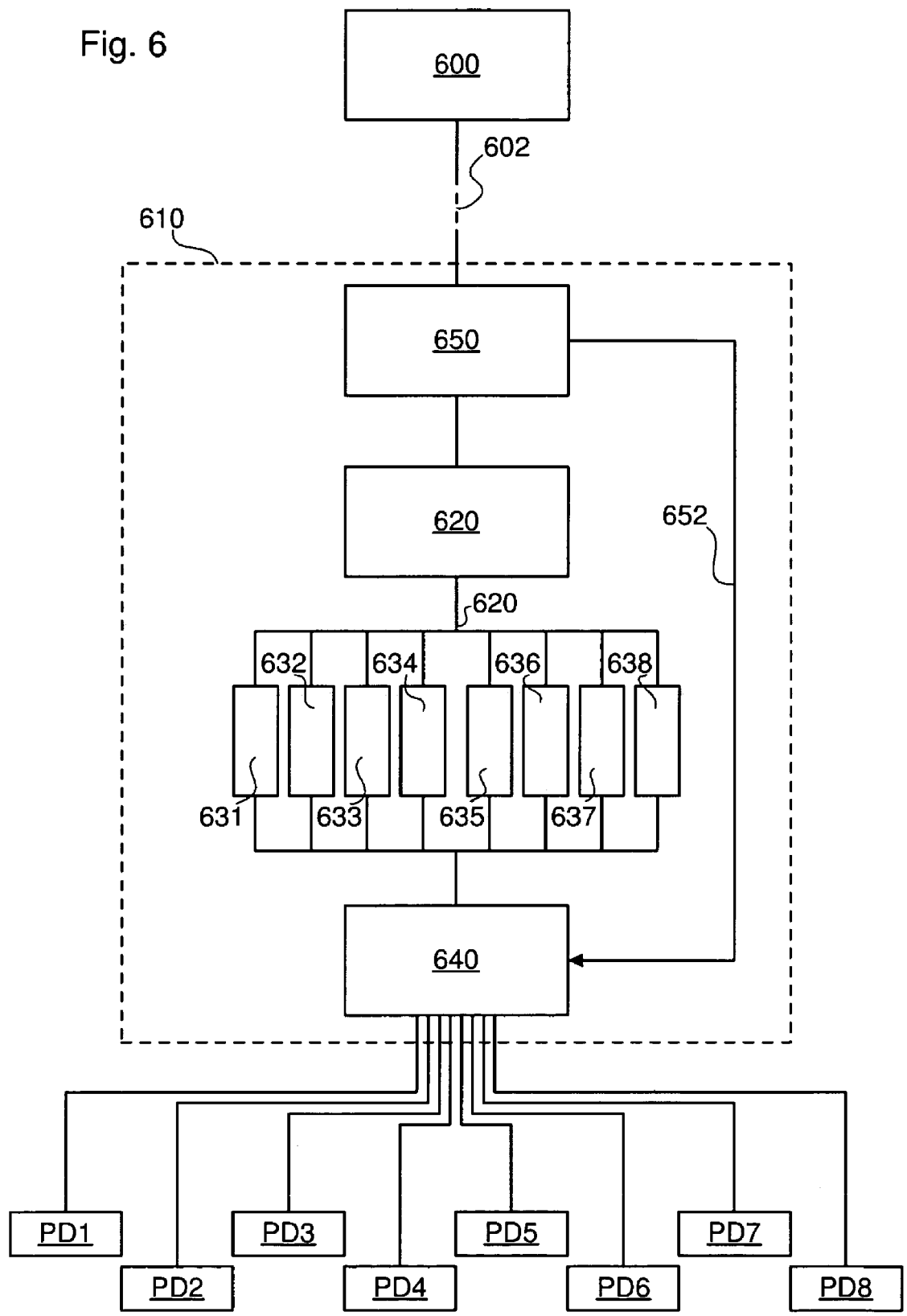
FIG. 6 depicts a calculation load controller and data redistribution device in a lithographic apparatus, according to one embodiment of the present invention.

FIG. 6 illustrates a system, according to one embodiment of the present invention. For example, this arrangement can be used alleviate excess capacity, and thereby reduce the cost of the lithographic apparatus for a comparable performance and/or improve the performance for a comparable cost. Although the system shown comprises multiple optical engines (indicated by the plurality of patterning devices PD1-PD8), the scope of the invention also extends to systems that comprise only a single optical engine, or more than 8 optical engines, for which a plurality of data manipulation devices are provided to process different regions of the requested pattern in parallel.

In this embodiment, an input device 600 is provided for inputting details of the required/requested dose pattern. This can be stored in the input device 600 as a vector-based representation, such as a GDSII file. The data is then passed to a data processing pipeline or data-path 610 via link 602. The link 602 is shown as a dotted line because this can comprise a direct link or a link made via one or more data processing devices, which can be provided to perform offline manipulations of the pattern data, for example. The portion of the data-path shown 610 is configured to perform one online stage (other stages can be processed by additional portions of the data-path that are not shown) of the conversion process between the vector-based representation of the requested dose-map (which can already have been partially converted by offline devices and/or other online devices) and the bitmap-based sequences of control data that are needed by the patterning devices PD1-PD8. As mentioned above, the online stage of the conversion process can comprise real-time decompression or real-time rasterization, for example.

The online stage(s) of the conversion require(s) substantial computation resources and the load can be split between a number of data manipulation devices 631-638, for example equal in number to the number of patterning devices PD1-PD8. However, instead of splitting the data according to the regions of the pattern to be exposed by respective patterning devices PD1-PD8, or in some other geometrically or otherwise convenient way, the present embodiment includes a calculation load controller 620, which is configured to distribute the pattern data according to the workload that each portion will represent for the data manipulation device concerned, so as to spread the total workload evenly or in an otherwise optimal and/or balancing way. In particular, the device 620 is arranged to receive a (normally partially processed) representation of the requested dose pattern, split the data according to a predetermined load distribution algorithm, and forward the resulting packets of data, each corresponding to particular regions of the dose pattern, to the data manipulation devices 631-638. The load distribution algorithm can operate in the same way for each requested dose pattern, relying, for example, on splitting the dose pattern into small regions ("tiles") and arranging for different data manipulation devices predominantly to process neighboring regions. As long as the regions are chosen to be significantly smaller than the expected length scale over which the pattern complexity (or other characteristic relevant to the calculation load) varies greatly, this approach should provide an effective way to spread the overall calculation load.

Additionally or alternatively, a pattern pre-processor 650 can be provided that is able to scan through the requested dose pattern and determine the spatial variation of properties of the pattern relevant to the operation of the data manipulation devices. For example, the pre-processor 650 can produce an entropy or pattern complexity map. The calculation load controller 620 can be configured to evaluate how best to distribute the calculation load between the data manipulation devices based on the output of the pattern pre-processor. For example, the load distribution algorithm can ensure that data corresponding to regions evaluated as being of high entropy/complexity etc., and thus likely to involve substantial resources to process, are split evenly between the data manipulation devices. The pre-processor 650 is shown as an online part of the data-path 610 in FIG. 6 but the pre-processor 650 can also operate offline.

For example, a lithography device according to an embodiment can be arranged to form a pattern for a plurality of LCD displays on the substrate. Each LCD has a large central region with a high degree of repetition (i.e., the repeating display pixels). At the border of the display, regions exist with more "white noise" (random variation, high entropy) patterns. The load distribution algorithm and/or tile size can be varied until a desirable balance is achieved between increased overall processing workload (the use of smaller tiles can lead to an increase in the overall workload, for example) and improved balancing of the workload between the data manipulation devices 631-638. According to a variation, smaller tiles can be chosen for areas of high entropy, such as the border areas in this example, and larger tiles for areas of lower entropy, such as the display areas, so as to balance the workload (in this case, by reducing the variation in workload associated with different tiles). Controlling the tile size according to the complexity of the pattern can be carried out either by reference to the output of a pre-processor, such as pre-processor 650, or by reference to a pre-defined description of the pattern layout (in the example given, such a description might include the outlines of display and border areas).

The data manipulation devices 631-638 process the data packets (e.g., rasterize or decompress) and output the processed data to a data redistribution device 640. The data re-distribution device 640 uses the data from the data manipulation devices 631-638 to produce sequences of control data or, at least, packets of data that can easily be converted (for example, via a simple decompression algorithm) to sequences of control data, to forward to each of the patterning devices PD1-PD8. A data connection 652 can be provided with the calculation load controller 620 to provide information, if required, about how the pattern data has been distributed between the data manipulation devices 631-638. A buffer can be provided to allow for timing differences between the outputs from different data manipulation devices 631-638 and to allow efficient recombination of the processed data before it is forwarded to the patterning devices PD1-PD8.

Figures 7A, 7B:
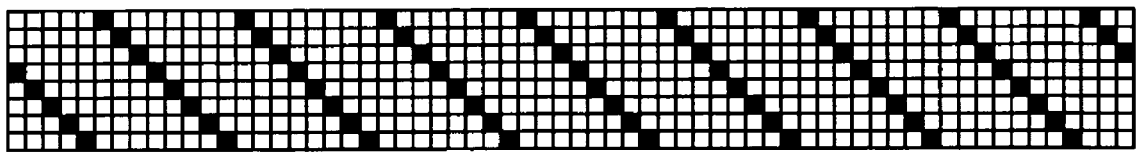
FIGS. 7a and 7b illustrate how sub-regions within a calculation window are distributed between data manipulation devices, according to one embodiment of the present invention.

FIG. 7a illustrates how the calculation load controller 620 is configured to distribute pattern data corresponding to an example region 530 of the pattern (see FIG. 5), according to one embodiment of the present invention. The region 530 is split into a number of sub-regions 701-708. In the example shown, 64 sub-regions are used, but a greater or smaller number can also be chosen. The regions are then assigned to particular data manipulation devices. In the present embodiment, there are 8 data manipulation devices 631-638 and the 64 sub-regions are divided along diagonals (from top-left to bottom-right), with sub-regions lying along neighboring diagonals being forwarded to different data manipulation devices and sub-regions lying along the same diagonal being forwarded to the same data manipulation device. In this example, the pattern data associated with eight of the sub-regions 701-708 is forwarded to each data manipulation device and this is conveniently achieved by forwarding data from subsequent diagonals to subsequent data manipulation devices. For example, sub-regions 701 might be forwarded to data manipulation device 631, sub-regions 702 to data manipulation device 632 etc.

FIG. 7b shows how such a pattern distribution strategy can be made to extend across the calculation window 520, according to one embodiment of the present invention. The blacked-out squares correspond to sub-regions 705, and are highlighted in this way to show how the input to a single data manipulation device (in this case, device 635) can be distributed over a calculation window 520. The input to the other data manipulation devices will be distributed in a very similar way, but this has not been shown in the interests of clarity. The diagonal and spaced-out geometry of the sub-regions corresponding to any one of the data manipulation devices is very unlikely to follow the geometry of variations in entropy/complexity in the device pattern. Similarly, large regions of particularly difficult pattern, such as the border regions 530 in a flat panel display, are distributed evenly between the data manipulation devices 631-638. The result is that the variation in calculation load between data manipulation devices 631-638 is significantly reduced for all requested dose patterns likely to be encountered. This means that the capacity of each of the data manipulation devices 631-638 can be lower for the same overall performance because the peak load will be substantially lower.

The distribution shown in FIGS. 7a and 7b is just an example of how the calculation load controller can be configured. The pattern can be divided in other ways without departing from the scope of the invention. For example, the sub-regions 701-708 in the calculation window 520 can be distributed randomly between the data manipulation devices. This further reduces the likelihood of device features accidentally lying along the geometry of the sub-regions for a particular data manipulation device (which can cause an unexpected spike or trough in the load for that data manipulation device).

FIG. 8 illustrates how the requested dose pattern is split into tiles of variable size by the calculation load controller 620, according to one embodiment of the present invention. The tile size can be controlled according to the "nature" of the requested dose pattern associated with each of the tiles. Relevant aspects of the pattern "nature," in this context, are properties that affect how the data manipulation devices process the tile (see below), for example, how much calculation workload is required to process the tile. In the example shown, the requested dose pattern 800 comprises regions of high pattern complexity/entropy 810 (which can correspond to border regions in a pattern for flat panel displays) and regions of low pattern complexity/entropy 820 (which can correspond to display regions in a pattern for flat panel displays). In order to reduce the variation in the calculation load associated with processing different tiles, the load controller 620 divides the pattern so that tiles 840 in the low complexity regions are larger than tiles 830 in the high complexity regions. In the example given, the tile sizes are controlled as a function of the complexity and/or entropy of the requested dose pattern within the tile. However, the tile size can in general be varied as a function of other properties linked to calculation workload in order to reduce the variation between tiles (and therefore also facilitate a reduction in the workload variation between the data manipulation devices). For example, the density of device features in the pattern can be used as a basis for controlling the tile size. The choice of which pattern property to use as reference in this regard can depend on a number of factors, including not only the nature of the processing to be carried out by the data manipulation devices, but also how easily the pattern property in question can be measured/quantified and how reliable is the relationship between the pattern property and the calculation workload for the tile. Compression ratios (which provide a measure of the degree to which the pattern can be compressed) can be used to quantify the pattern entropy/complexity, for example. The calculation load controller 620 can implement tile size control independently, or combine tile size control with the function of distributing tiles intelligently between data manipulation devices (as discussed above), in order efficiently to effect a desired level of workload balancing.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography apparatus, comprising:
a patterning device comprising an array of individually controllable elements configured to impart a pattern to a cross-section of a beam of radiation;
a projection system configured to project the patterned beam of radiation onto a target portion of a substrate;
a data processing pipeline configured to convert a first data representation of a requested dose pattern to a sequence of control data suitable for controlling respective individually controllable elements in the array of individually controllable elements to form the pattern in the beam using the patterning device, such that the requested dose pattern is formed on a substrate, the data processing pipeline comprising,
a plurality of data manipulation devices, and
a calculation load controller configured to divide the first data representation into a plurality of data packets, each corresponding to one of a set of sub-regions of the requested dose pattern corresponding to subsets of the individually controllable elements in the patterning device, and configured to forward each of the data packets to a respective one of the data manipulation devices,
wherein the calculation load controller is configured to select the data packets to forward to each of the data manipulation devices so as to balance a total calculation load between the data manipulation devices, and
wherein the calculation load controller is configured to control a size of each of the sub-regions according to at least one of a degree of pattern irregularity, a pattern entropy, and a compression ratio of the portion of the requested dose pattern corresponding to that sub-region.

2. The lithography apparatus of claim 1, further comprising:
a pattern pre-processor configured to analyze the first data representation and output data indicative of how each of a plurality of areas of the pattern are expected to contribute to the calculation load for at least one stage of the conversion carried out by the data manipulation devices, and
wherein the calculation load controller is configured to select the data packets based on the output data.

3. The lithography apparatus of claim 1, further comprising:
a data re-distribution device configured to receive and re-combine data output from the plurality of data manipulation devices in order to form the sequence of control data.

4. The lithography apparatus of claim 1, wherein the calculation load controller is configured to select data packets for each of the plurality of data manipulation devices substantially at random.

5. The lithography apparatus of claim 4, wherein the sub-regions are selected to be small enough in comparison with features of the requested dose pattern to ensure that the total calculation load is substantially balanced.

6. The lithography apparatus of claim 1, wherein the load controller is configured to control the size of each of the sub-regions according to the degree of pattern irregularity.

7. The lithography apparatus of claim 1, wherein the load controller is configured to control the size of each of the sub-regions according to the pattern entropy.

8. The lithographic apparatus according to claim 1, wherein the load controller is configured to control the size of each of the sub-regions according to the compression ratio.

9. A lithography apparatus, comprising:
a plurality of patterning devices, each comprising an array of individually controllable elements, wherein each patterning device is configured to impart a pattern to a cross-section of one of a plurality of beams of radiation;
a projection system configured to project the plurality of patterned beams of radiation onto respective target portions of a substrate;
a data processing pipeline configured to convert a first data representation of a requested dose pattern to a sequence of control data suitable for controlling respective individually controllable elements in the arrays of individually controllable elements to form the patterns in the beams using the patterning devices, such that the requested dose pattern is formed on a substrate, the data processing pipeline comprising,
a plurality of data manipulation devices, and
a calculation load controller configured to divide the first data representation into a plurality of data packets, each corresponding to one of a set of sub-regions of the requested dose pattern corresponding to subsets of the individually controllable elements in the patterning devices, and configured to forward each of the data packets to a respective one of the data manipulation devices, wherein the calculation load controller is configured to select the data packets to forward to each of the data manipulation devices so as to balance a total calculation load between the data manipulation devices wherein the data processing pipeline is configured to convert the first data representation of the requested dose pattern into a plurality of sequences of control data, each suitable for controlling one of the patterning devices in order together substantially to form the requested dose pattern on a substrate; and wherein each of the data manipulation devices is configured to process data packets in order to generate control data for any one of the patterning devices, and wherein a geometry of the sub-regions corresponding to any one of the data manipulation devices is uncorrelated with a geometry of variations in entropy in the requested dose pattern.

10. A lithographic apparatus according to claim 9, further comprising:
a pattern pre-processor configured to analyze the first data representation and output data indicative of how each of a plurality of areas of the pattern are expected to contribute to the calculation load for at least one stage of the conversion carried out by the data manipulation devices, and wherein the calculation load controller is configured to select the data packets based on the output data.

11. A lithographic apparatus according to claim 9, further comprising:
a data redistribution device configured to receive and re-arrange data output from the plurality of data manipulation devices in order to form the plurality of sequences of control data.

12. A lithographic apparatus according to claim 9, wherein the calculation load controller is configured to select data packets for each data manipulation device substantially at random.

13. A lithographic apparatus according to claim 12, wherein the sub-regions are arranged to be small enough in comparison with features of the requested dose pattern to ensure that the total calculation load is substantially balanced.

14. A lithographic apparatus according to claim 9, wherein the calculation load controller is configured to forward data packets to at least one of the data manipulation devices that correspond to a set of the sub-regions lying along at least one line oblique to a scanning direction of the substrate relative to the beam of radiation projected thereon.

15. A device manufacturing method, comprising:
using a patterning device comprising an array of individually controllable elements to impart a pattern to a cross-section of a beam of radiation;
using a projection system to project the patterned beam of radiation onto a target portion of a substrate;
converting a first data representation of a requested dose pattern to a sequence of control data suitable for controlling respective individually controllable elements in the array of individually controllable elements to form the pattern in the beam using the patterning device, such that the requested dose pattern is formed on a substrate;
dividing the first data representation into a plurality of data packets, each corresponding to one of a set of sub-regions of the requested dose pattern, and forwarding each of the data packets to one of a plurality of data manipulation devices for the conversion;
selecting the data packets to forward to each of the data manipulation devices in such a way that the total calculation load is balanced between the data manipulation devices; and
controlling the size of each of the sub-regions according to at least one of a degree of pattern irregularity, a pattern entropy, and a compression ratio of the portion of the requested dose pattern corresponding to that sub-region.

16. A device manufacturing method according to claim 15, further comprising:
analyzing the first data representation in order to determine how sub-region contributions to the calculation load for the stage of the conversion carried out by the data manipulation devices are expected to vary as a function of the position of the sub-regions within the requested dose pattern; and
carrying out the selecting step based on the results of the analyzing step.

17. A device manufacturing method according to claim 15, further comprising:
controlling the size of each of the sub-regions according to the degree of pattern irregularity.

18. A device manufacturing method according to claim 15, further comprising:
controlling the size of each of the sub-regions according to the pattern entropy.

19. A device manufacturing method according to claim 15, further comprising:
controlling the size of each of the sub-regions according to the compression ratio.

20. A device manufacturing method according to claim 15, comprising:
using a plurality of patterning devices, each comprising an array of individually controllable elements to impart a pattern to a cross-section of the beam;
converting the first data representation of the requested dose pattern into a plurality of sequences of control data, each suitable for controlling respective individually controllable elements in a given one of the arrays of individually controllable elements to form the pattern in the beam using the patterning devices, such that the requested dose pattern is formed on the substrate; and
using each of the data manipulation devices to process data packets from a plurality of the regions of the requested dose pattern, at least a subset of which are to be formed by different ones of the patterning devices, each comprising arrays of individually controllable elements.

* * * * *